(12) United States Patent
Kao

(10) Patent No.: US 6,847,251 B2
(45) Date of Patent: Jan. 25, 2005

(54) DIFFERENTIAL CHARGE PUMP CIRCUIT

(75) Inventor: Hsueh-Wu Kao, Chu Tong Chen (TW)

(73) Assignee: Media Tek, Inc. (TW)

( * ) Notice: Subject to any disclaimer, the term of this patent is extended or adjusted under 35 U.S.C. 154(b) by 230 days.

(21) Appl. No.: 10/336,748

(22) Filed: Jan. 6, 2003

(65) Prior Publication Data
US 2003/0146779 A1 Aug. 7, 2003

Related U.S. Application Data

(63) Continuation-in-part of application No. 10/041,490, filed on Jan. 10, 2002, now abandoned.

(30) Foreign Application Priority Data

Jan. 11, 2001 (TW) .................................... 90100669 A

(51) Int. Cl.[7] .............................. G05F 1/10; G05F 3/02
(52) U.S. Cl. ..................................................... 327/536
(58) Field of Search ................................ 327/148, 157, 327/390, 536, 537, 589; 363/60

(56) References Cited

U.S. PATENT DOCUMENTS 5,736,880 A * 4/1998 Bruccoleri et al. ......... 327/157
6,249,181 B1 * 6/2001 Marble ........................... 330/9
6,255,873 B1 7/2001 Johnson et al. ............. 327/157
6,275,097 B1 8/2001 Liang et al. ................. 327/536
6,525,684 B2 * 2/2003 Tsujikawa .................... 341/155
6,580,326 B2 * 6/2003 Bach et al. .................. 330/277

* cited by examiner

*Primary Examiner*—My-Trang Nu Ton
(74) *Attorney, Agent, or Firm*—Birch, Stewart, Kolasch & Birch, LLP

(57) ABSTRACT

A differential charge pump circuit for eliminating influence of mismatches between current sources is disclosed. The differential charge pump circuit includes a floating capacitor for providing an output voltage, a slicer for outputting a comparison signal to control a charge/discharge actions of the floating capacitor, a first current source, a second current source, a first-common-mode current source, a second-common-mode current source, and a third-common-mode current source connected in parallel with the first current source. The differential charge pump circuit of the present invention utilizes switches to switch the charge and discharge current paths of the capacitor with respect to the common mode current source and the charge/discharge current source. Therefore, the duty cycle of the output signal is free from being adversely influenced by the mismatches between the current sources.

12 Claims, 7 Drawing Sheets

DIFFERENTIAL CHARGE PUMP CIRCUIT

This is a continuation-in-part of application Ser. No. 10/041,490, filed Jan. 10, 2002 now abandoned, the entire contents of which are hereby incorporated by reference, and this application claims priority under 35 U.S.C. §119 to Taiwan Application 090100669, filed Jan. 11, 2001, the entire contents of which are hereby incorporated by reference.

BACKGROUND OF THE INVENTION

A. Field of the Invention

The invention relates to a differential charge pump circuit, and more particularly, to a differential charge pump circuit using a method of exchanging common mode current sources to decrease the influence of the mismatches between the common mode currents upon the duty cycle.

B. Description of the Related Art

In the applications of optical storage, the data patterns are embossed on the disk. The embossed pattern signals of the disk are read out by a photo detector and is translated into a voltage signal named RF signal. The RF signal are processed through an automatic gain control circuit, an equalizer circuit and a buffer circuit and then is fed to a slicer circuit to slice data as high or low. The signals after the slicer are bit stream patterns with 1 or 0. If the data "1" is weighted 1 and the data "0" is weighted −1, due to the data format of the disk, the digital sum value (DSV) is equal to 0 for long term. The total numbers of data "1" are equal to total numbers of data "0". Due to the data's digital sum value is equal to 0, we can use a close-loop charge pump control system to set the optimum slicer level to acquire a zero digital sum value result.

A general charge pump circuit is a close-loop control system that has to overcome pre signal processing's offset so as to set up an optimum slicer level and to get a data string with digital sum value equal to 0. FIG. 1 shows a single-end charge pump 14 used in a single-end close loop system which sets up an optimize slicer level and then uses a trans-conductance circuit 12 to offset a dc current to the buffer 11 and to adjust the slicer level of the slicer 13. The slicer 13 is used to generate a comparison signal (output signal) to control the charge and discharge of the capacitor. Due to the digital sum value is equal to 0's disk format, when the close loop feedback system reaches its equilibrium state, the charging charge is equal to the discharging charge in the same one cycle. That is:

$$I_{up}*X\% = I_{dn}*(100-X\%),$$

wherein X is the percentage of data "1", $I_{up}$ is the current of the upper charging current source, and $I_{dn}$ is the current of the lower discharging current source. Thus, the the percentage of data "1" of the close loop system is:

$$X=(I_{up}/(I_{up}+I_{dn})) \qquad (1)$$

If $I_{up}=I_{dn}$, then X=50% and it means that the data bit streams with the same numbers of data "1" and data "0". However, the slicing out signals with digital sum value equal to 0 can not be generated owing to that there are some mismatches between the currents $I_{up}$ and $I_{dn}$. In the semiconductor manufacturing processes. If the $I_{up}$ is not equal to the $I_{dn}$, then X will not equal to 50% and digital sum value will not equal to zero.

Consequently, a differential charge pump circuit as shown in FIG. 2 has been disclosed to solve the problem of current mismatches between the currents $I_{up}$ and $I_{dn}$. In this charge pump circuit 24, the charging and discharging actions are performed at both terminals of the floating capacitor C. In addition, the two terminals of the floating capacitor C are switched according to the output result (H or L) in order to compensate the problem of current mismatches between the upper charging and lower discharging current sources in single end charge pump circuits, such as the example shown in FIG. 1.

FIG. 3 shows the charge and discharge paths for the differential charge pump circuit in FIG. 2, wherein φH indicates that the controlled switch is ON when the slicer is H, while φL indicates that the controlled switch is ON when the slicer is L.

Once the differential charge pump circuit 24 is adopted, it is necessary to provide a common mode path between the two terminals of the floating capacitor C by a common-mode feed back unit 25 in order to set the common mode voltage at the two terminals of the floating capacitor C.

The right-hand common mode current $I_{CMR}$ and the left-hand common mode current $I_{CML}$ provide a common mode current path.

FIGS. 4(A) and 4(B) show the operation modes when the output of the slicer is H and L, respectively. These represent the two charge paths of FIG. 3. However, there will be some mismatches between $I_{CMR}$ and $I_{CML}$ in the semiconductor manufacturing processes. As shown in FIG. 4, it is assumed that the right-hand common mode current $I_{CMR}$ equals to K times of the left-hand common mode current $I_{CML}$ (due to process mismatch), and that $I_{CM1}$ and $I_{CM0}$ equal to the left-hand common mode currents $I_{CML}$ when the output of the slicer is H and L, respectively. Under this condition and assumption, the current flowing into the upper plate of the capacitor C equals to the current flowing out of the bottom plate of the capacitor. Therefore, $$I_1=I_{up}+I_{CM}-I_{CM1}=I_{dn}+KI_{CM1} \qquad (2)$$

$$I_0=I_{up}+I_{CM}-KI_{CM0}=I_{dn}+I_{CM0} \qquad (3).$$

From the equations (2) and (3), $I_{CM1}=I_{CM0}$ $$I_1*X=I_0*(1-X) \qquad (4)$$

$$(I_{up}+I_{CM}-I_{CM1})*X=(I_{dn}+I_{CM0})*(1-X)$$

$$X=(I_{up}+I_{CM}-KI_{CM1})/(2I_{up}+2I_{CM}-(1+K)I_{CM1}) \qquad (5)$$

If K=1, the left-hand and right-hand common mode currents fully match with each other, and

X=50% (6)

It means the digital sum value is equal to 0. Accordingly, it can be proved from Equation (6) that the duty cycle X is independent of the current $I_{up}$ and $I_{dn}$ when K=1. However, under the condition that K≠1 (i.e., the left-hand common mode current $I_{CML}$ is not equal to the right-hand common mode current $I_{CMR}$, the duty cycle X still cannot be kept at 50%.

Although we can use differential charge pump circuit to overcome charge and discharge current mismatch issue, but if the common mode current path has mismatch, it still contributes to the close loop charge pump system and X still cannot be kept at 50%.

SUMMARY OF THE INVENTION

In view of the above-mentioned problems, it is therefore an object of the invention to provide a differential charge pump circuit in a close loop system to set up an optimize slicer level without the influence of the mismatches between the common mode current and the charge/discharge current, and capable of keeping a long term digital sum value equal to 0.

One aspect of the present invention is to provide a differential charge pump circuit for eliminating influence of mismatches between common mode current sources and keeping an output voltage having a 50% duty cycle. The differential charge pump circuit includes a capacitor, a slicer, a first current source, a second current source, a first-common-mode current source, a second-common-mode current source, and a third-common-mode current source. The capacitor has a first terminal and a second terminal and provides an output voltage. The slicer outputs a comparison signal to control a charge/discharge action of the capacitor. The first current source includes a positive terminal and a negative terminal. The positive terminal is connected to a positive reference voltage. The negative terminal is connected to the first terminal of the capacitor when the comparison signal is H, and to the second terminal of the capacitor when the comparison signal is L. The second current source includes a positive terminal and a negative terminal. The negative terminal of the second current source is connected to a negative reference voltage. The positive terminal of the second current source is connected to the second terminal of the capacitor when the comparison signal is H, and to the first terminal of the capacitor when the comparison signal is L. The first-common-mode current source includes a positive terminal and a negative terminal. The negative terminal is connected to the negative reference voltage. The positive terminal is connected to the first terminal of the capacitor when the comparison signal is H, and to the second terminal of the capacitor when the comparison signal is L. The second-common-mode current source includes a positive terminal and a negative terminal. The negative terminal is connected to the negative reference voltage. The positive terminal is connected to the second terminal of the capacitor when the comparison signal is H, and to the first terminal of the capacitor when the comparison signal is L. The third-common-mode current source is connected in parallel with the first current source.

BRIEF DESCRIPTION OF THE DRAWINGS

These and other objects and advantages of the present invention will become apparent by reference to the following description and accompanying drawings wherein:

FIGS. 4(A) and (B) show the charge paths of FIG. 3, wherein FIG. 4(A) shows the charge path when the slicer is H and FIG. 4(B) shows the charge path when the slicer is L;

FIG. 6 shows the charge path of FIG. 5, wherein

DETAILED DESCRIPTION OF THE INVENTION

The differential charge pump circuit of the present invention will be described with reference to the accompanying drawings.

Figure 1:
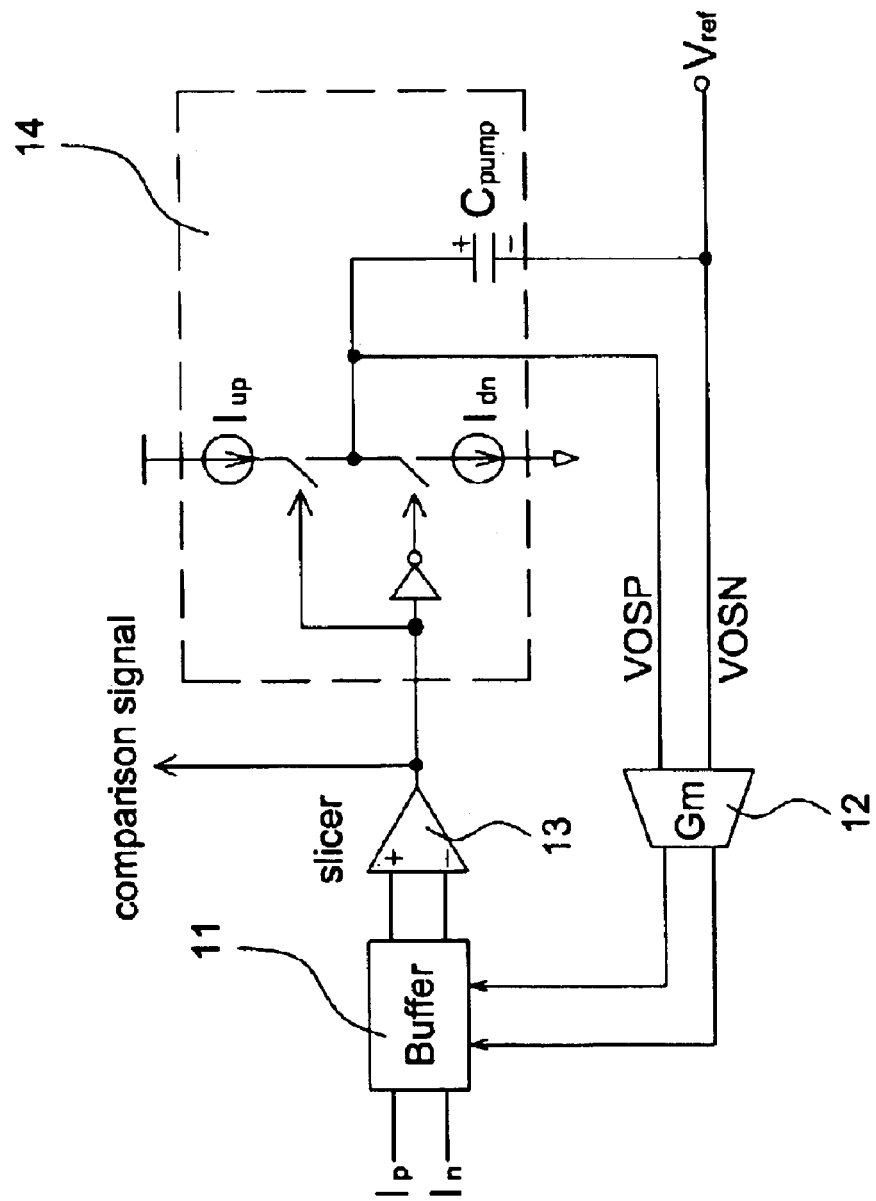
FIG. 1 shows a conventional single-end charge pump.
Figure 2:
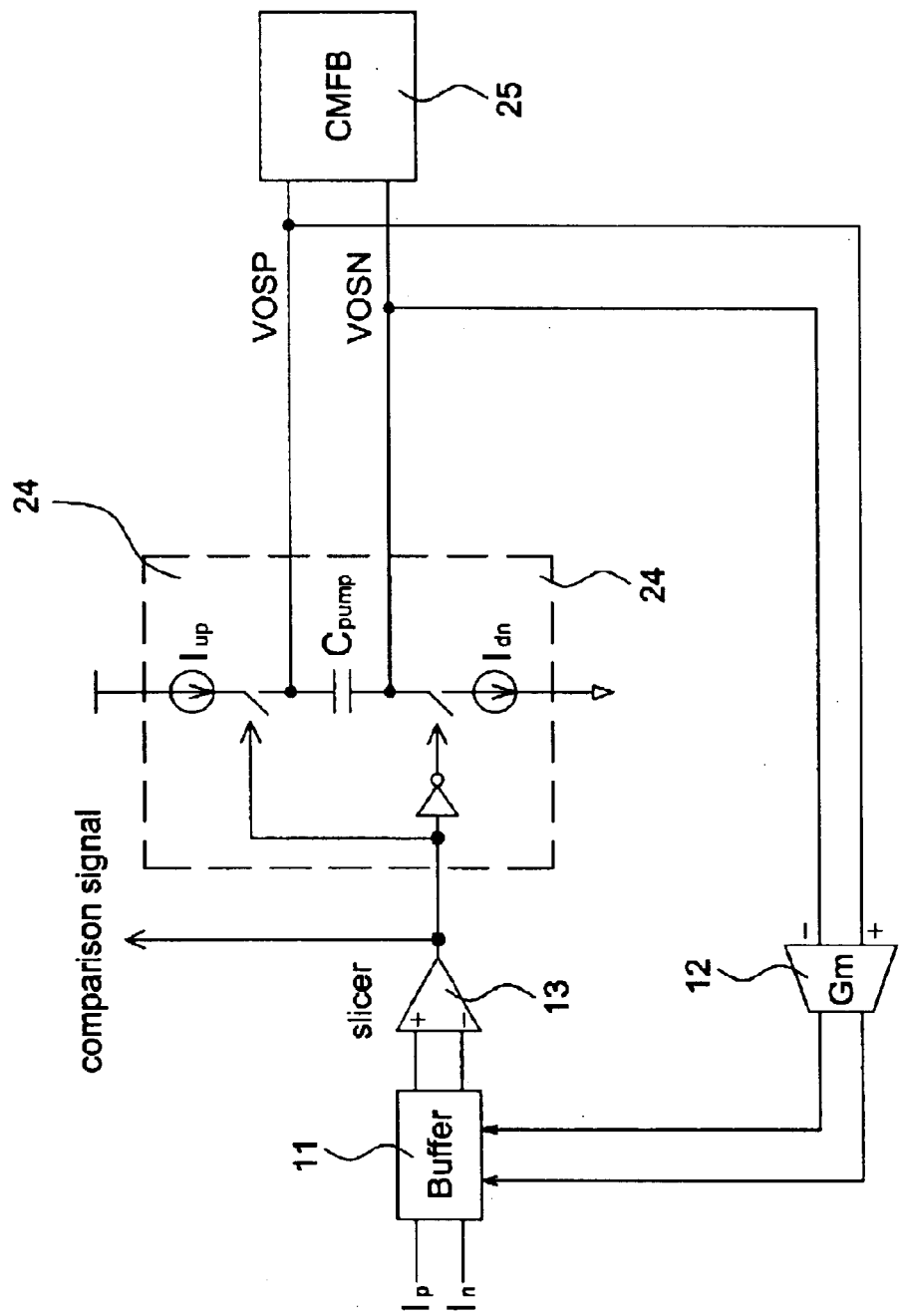
FIG. 2 shows a conventional differential charge pump.
Figure 3:
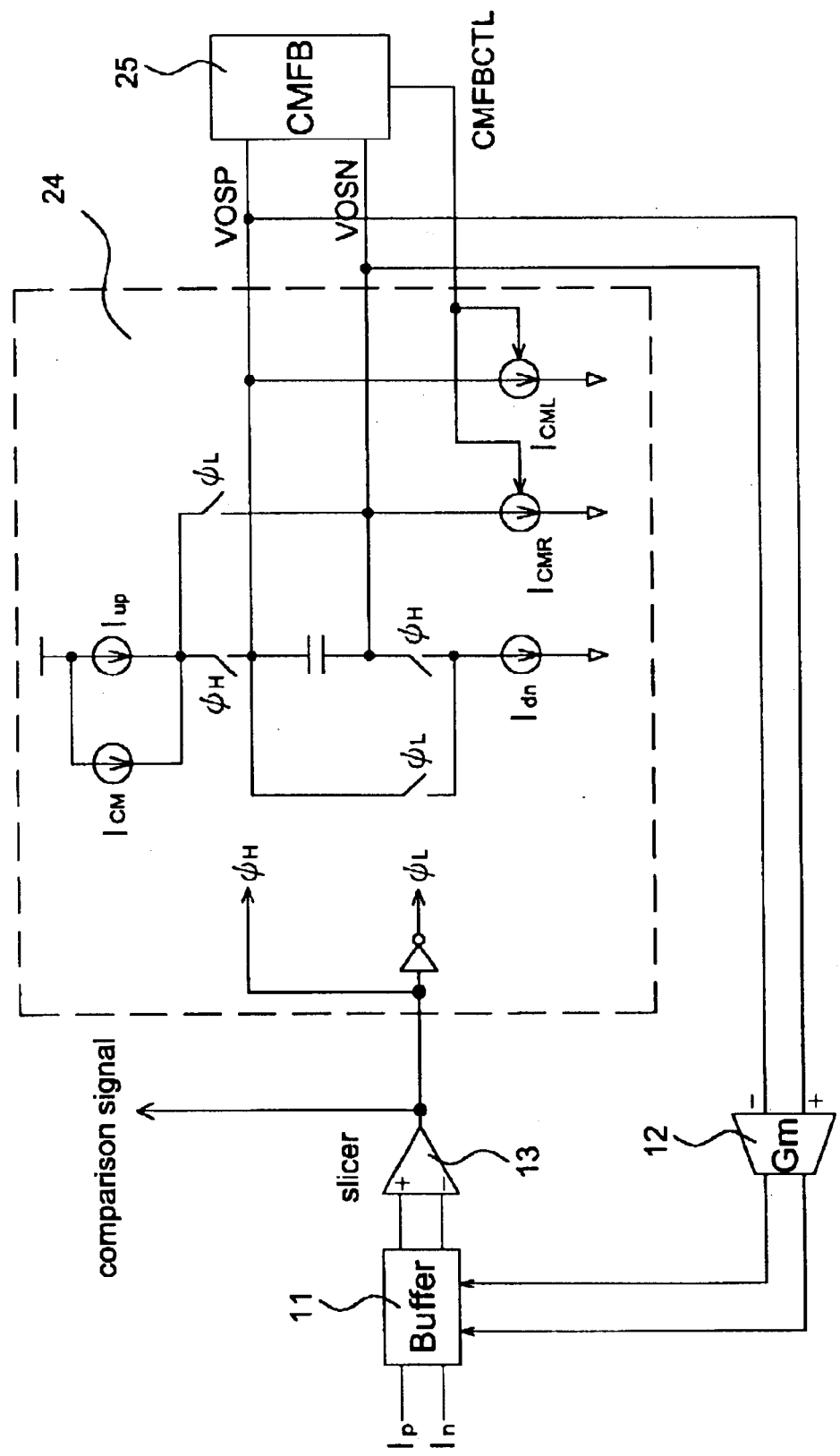
FIG. 3 shows the circuit of the differential charge pump of FIG. 2.
Figure 4A:
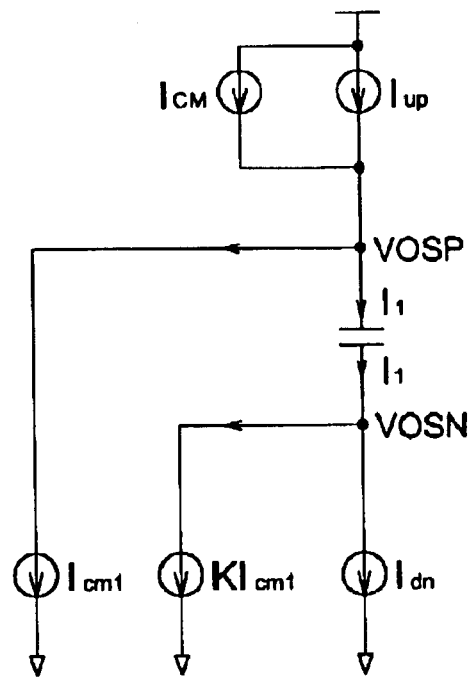
Figure 4B:
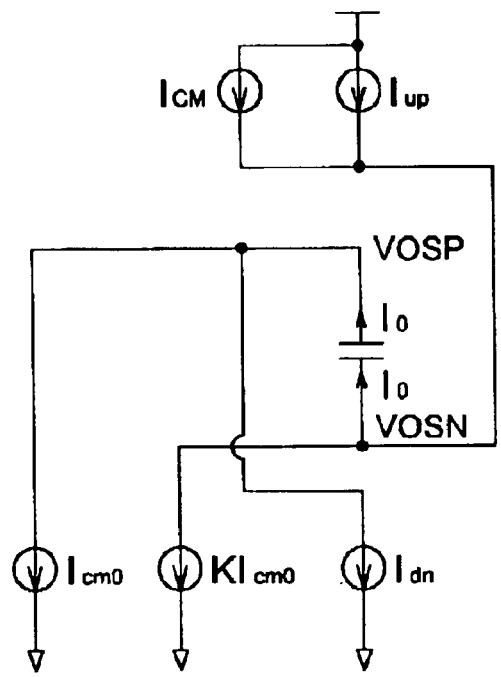
Figure 5:
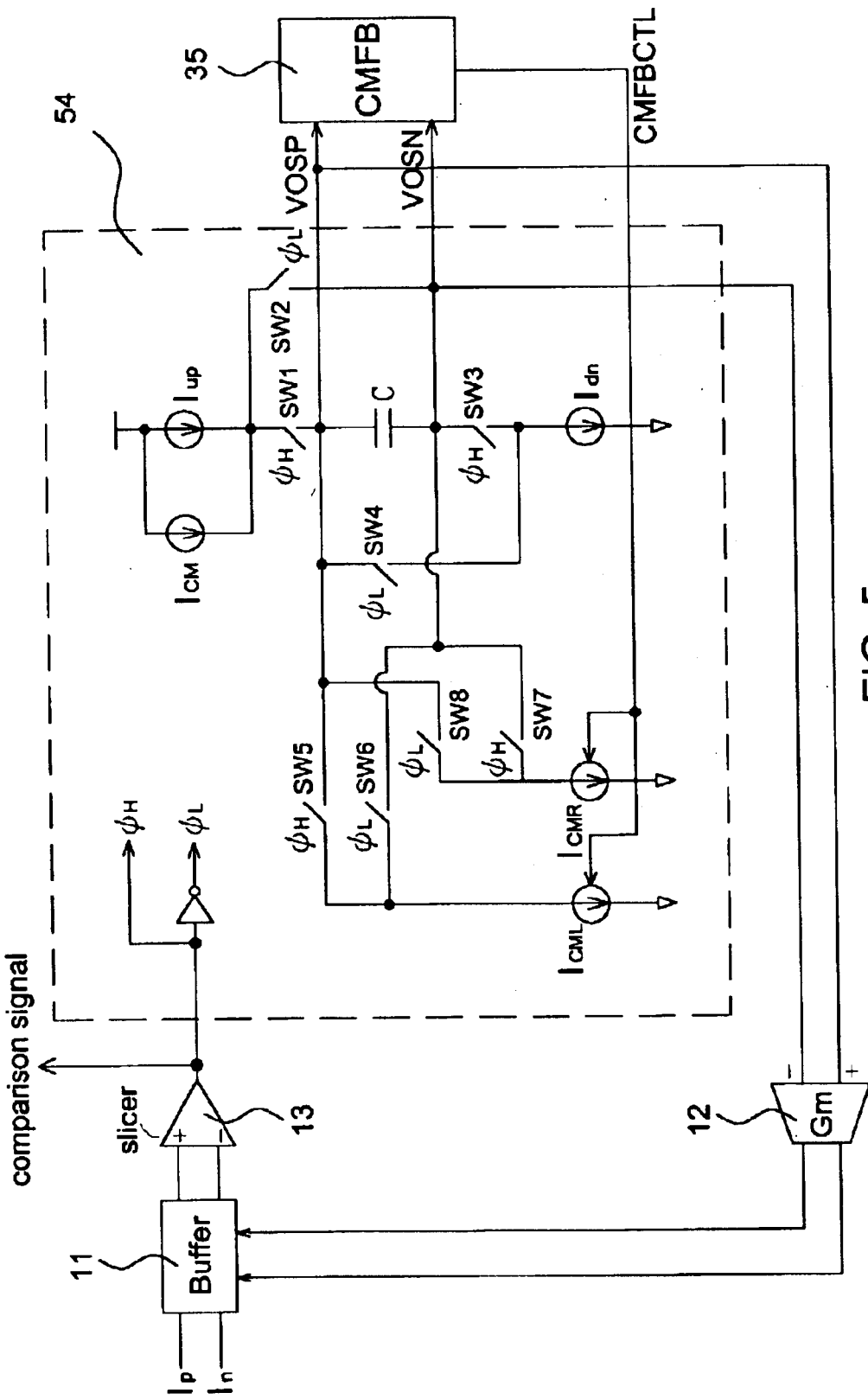
FIG. 5 shows the circuit of the differential charge pump in accordance with the first embodiment of the present invention.

FIG. 5 shows the differential charge pump circuit in accordance with a first embodiment of the present invention. As shown in this drawing, the differential charge pump 54 is the same as a general differential charge pump (as shown in FIG. 3) in that a slicer 13 is used to generate a comparison signal to switch the charge and discharge paths of each current source with respect to the floating capacitor C. The conventional differential charge pump only switches the charge and discharge paths of the upper charging current source $I_{up}$ and the lower discharging current source $I_{dn}$ with respect to the floating capacitor C. The differential charge pump 54 of this present invention, however, switches not only the charge and discharge paths of the upper charging current source $I_{up}$ and the lower discharging current source $I_{dn}$ with respect to the capacitor C, but also the charge and discharge paths of the common mode current source $I_{CM}$ with respect to the floating capacitor C. Therefore, the differential charge pump 54 of this present invention is free from being influenced by the mismatches between the upper charging current source, the lower discharging current source, and the common mode current source, and still can keep the digital sum value (DSV) 0.

As shown in FIG. 5, the differential charge pump 54 of the present invention includes a floating capacitor C, an upper charging current source $I_{up}$, a lower discharging current source $I_{dn}$, a common mode current source $I_{CM}$, a left-hand common mode current source $I_{CML}$, and a right-hand common mode current source $I_{CMR}$.

A positive terminal VOSP and a negative terminal VOSN of the floating capacitor C provide output voltages which is fed into a trans-conductance circuit 12 to adjust the slicer level of the slicer 13. The common mode current source $I_{CM}$ and the upper charging current source $I_{up}$ are connected in parallel, connected to the positive terminal VOSP of the capacitor C via a first switch SW1, and connected to the negative terminal VOSN of the capacitor C via the second switch SW2. The lower discharging current source $I_{dn}$ is connected to the negative terminal VOSN of the capacitor C via a third switch SW3, and is connected to the positive terminal VOSP of the capacitor C via a fourth switch SW4. The left-hand common mode current source $I_{CML}$ is connected to the positive terminal VOSP of the capacitor C via a fifth switch SW5, and is connected to the negative terminal VOSN of the capacitor C via a sixth switch SW6. The right-hand common mode current source $I_{CMR}$ is connected to the negative terminal VOSN of the capacitor C via a seventh switch SW7, and is connected to the positive terminal VOSP of the capacitor C via an eighth switch SW8.

Figure 6A:
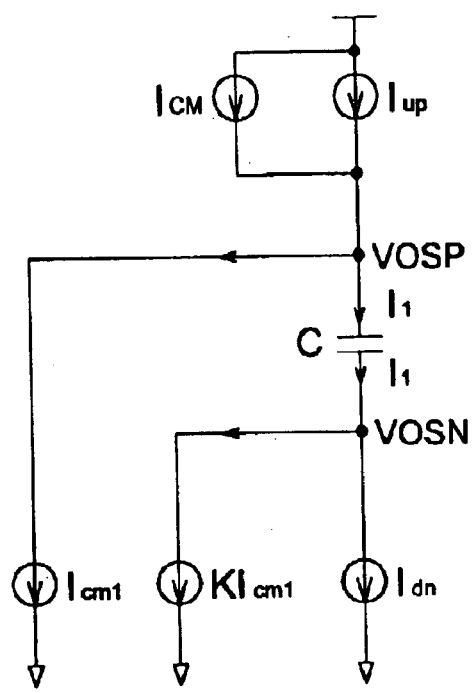
FIG. 6(A) shows the charge path when the slicer is A.
Figure 6B:
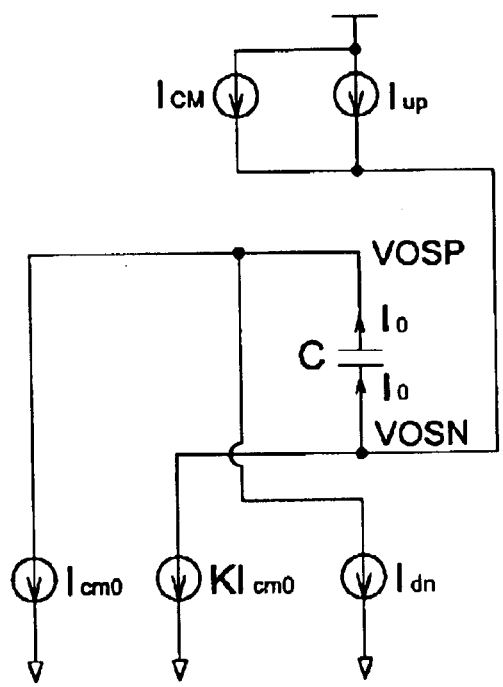
FIG. 6(B) shows the charge path when the slicer is L.

FIGS. 6(A) and 6(B) show current paths when the output of the slicer of FIG. 5 is H and L, respectively. The fact that the differential charge pump 54 of this present invention is free from being influenced by the mismatches between the common mode current and the charge and discharge currents and the fact that the charge pump can keep DSV 0 will be proved in the following. First, it is assumed that the right-hand common mode current $I_{CMR}$ equals to K times of the left-hand common mode current $I_{CML}$, that $I_{CM1}$ equals to the left-hand common mode currents $I_{CML}$ when the slicer is H, and that $I_{CM0}$ equals to the left-hand common mode currents $I_{CML}$ when the slicer is L. Under this assumption with reference to FIGS. 6(A) and 6(B), we obtain $$I_1 = I_{up} + I_{CM} - I_{CM1} = I_{dn} + KI_{CM1} \qquad (7)$$

$$I_0 = I_{up} + I_{CM} - I_{CM0} = I_{dn} + KI_{CM0} \qquad (8).$$

From Equation (8), we can obtain:

$$I_{dn} = I_{up} + I_{CM} - (K+1)I_{CM0} \qquad (9)$$

$$I_{CM0}=I_{CM1} \quad (10)$$

$$I_1*X=I_0*(1-X) \quad (11)$$

Substitute Equations (7) and (8) into Equation (11), we obtain:

$$(I_{up}+I_{CM}-I_{CM1})*X=(I_{dn}+KI_{CM0})*(1-X) \quad (12)$$

$$X=(I_{dn}+KI_{CM0})/(I_{up}+I_{CM}-I_{CM1}+I_{dn}+KI_{CM0}) \quad (13)$$

Substitute Equations (9) and (10) into Equation (13), we obtain:

$$X=(I_{up}+I_{CM}-I_{CM1})/(2I_{up}+2I_{CM}-2I_{CM1})=50\% \quad (14)$$

As a result, it can be proved from Equation (14) that the duty cycle X is a constant (50%), and is independent of the matches/mismatches between the upper charging current source, the lower discharging current source, and the common mode current.

Figure 7:
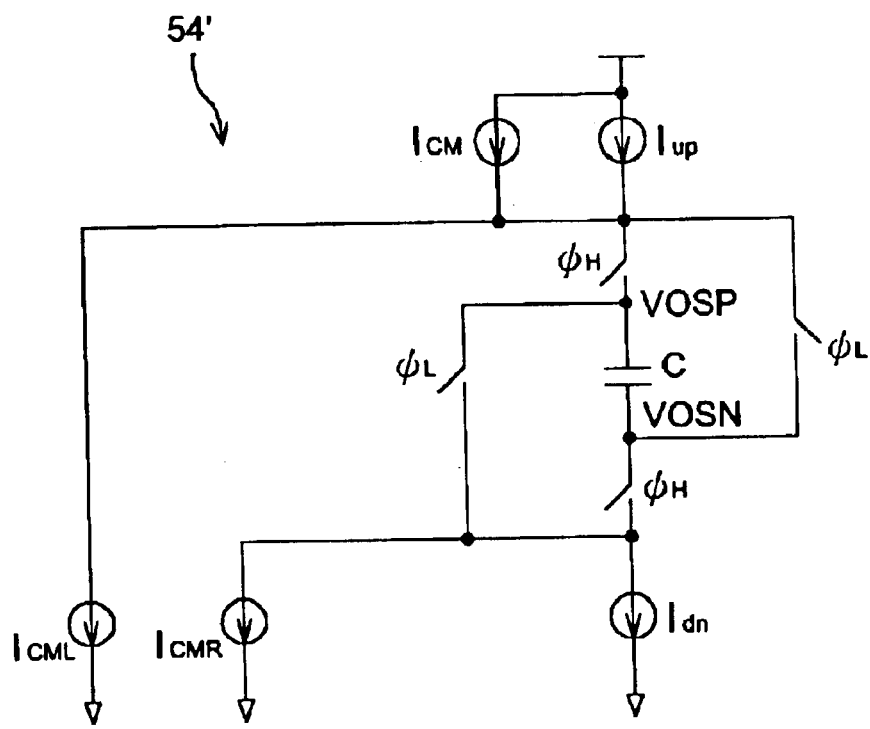
FIG. 7 shows a simplified circuit of the differential charge pump of the FIG. 5.

FIG. 7 shows a simplified circuit of the charge pump in FIG. 5. The left-hand common mode current source $I_{CML}$ of the charge pump 54 in FIG. 5 is connected to the upper charging current source $I_{up}$ when either the fifth switch SW5 or the sixth switch SW6 is ON. Therefore, the left-hand common mode current source $I_{CML}$ can be directly connected to the upper charging current source $I_{up}$ without the fifth switch SW5 and the sixth switch SW6. Similarly, the right-hand common mode current source $I_{CMR}$ of the charge pump 54 of FIG. 5 is always connected to the lower discharging current source $I_{dn}$ when either the seventh switch SW7 or the eighth switch SW8 is ON. Therefore, the right-hand common mode current source can be directly connected to the lower discharging current source $I_{dn}$ without the seventh switch SW7 and the eighth switch SW8. Consequently, the charge pump 54' of FIG. 7 is a simplified circuit of the charge pump 54 in FIG. 5, and both the charge pumps 54' and 54 have the same effect.

Figure 8:
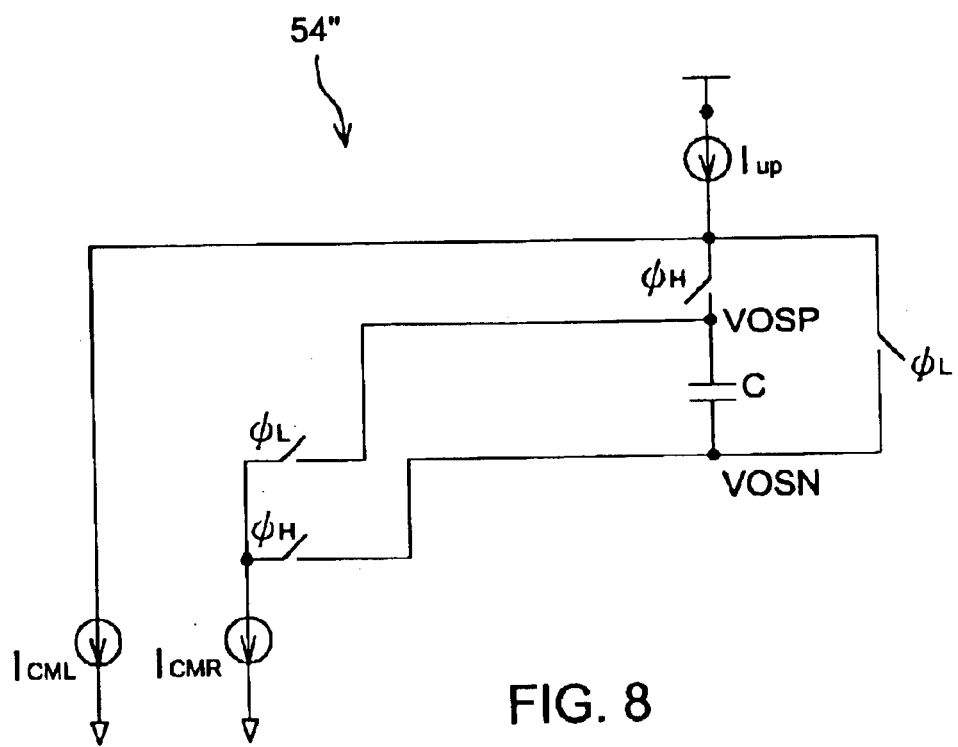
FIG. 8 shows a simplified circuit of the differential charge pump of the FIG. 7.

FIG. 8 shows a simplified circuit of the charge pump in FIG. 7. In the charge pump 54' of FIG. 7, since the common mode current source $I_{CM}$ and the upper charging current source $I_{up}$ are connected in parallel, the common mode current source $I_{CM}$ can be incorporated into the upper charging current source $I_{up}$. Similarly, since the right-hand common mode current source $I_{CMR}$ and the lower discharging current source $I_{dn}$ are connected in parallel, the lower discharging current source $I_{dn}$ can be incorporated into the right-hand common mode current source $I_{CMR}$. As a result, the differential charge pump 54" of the present invention as shown in FIG. 8 only needs three current sources, and the duty cycle can be free from being adversely influenced by the mismatches between the current sources.

The charge pump of the present invention utilizes switches to switch the charge and discharge current paths of the capacitor with respect to the common mode current source and the charge/discharge current source. Therefore, the duty cycle of the output signal is free from being adversely influenced by the mismatches between the current sources. In addition, since some switches can be omitted, the circuit can be further simplified.

Furthermore, since the charge pump of this invention possesses good immunity from mismatches between current sources, it is not necessary to use long channel devices or large area devices to assure better processing matches during the circuit layout. Therefore, the chip size can be greatly reduced, thereby decreasing the cost.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A differential charge pump circuit for eliminating influence of mismatches between current sources, the differential charge pump circuit comprising:

a capacitor for providing an output voltage and having a first terminal and a second terminal;

a first current source being connected to the first terminal of said capacitor when a comparison signal is a first level, and being connected to the second terminal of said capacitor when the comparison signal is a second level;

a second current source being connected to the second terminal of said capacitor when the comparison signal is the first level, and being connected to the first terminal of said capacitor when the comparison signal is the second level;

a first-common-mode current source being connected to the first terminal of said capacitor when the comparison signal is the first level, and the positive terminal being connected to the second terminal of said capacitor when the comparison signal is the second level;

a second-common-mode current source being connected to the second terminal of said capacitor when the comparison signal is the first level, and the positive terminal being connected to the first terminal of said capacitor when the comparison signal is the second level; and a third-common-mode current source connected in parallel with the first current source.

2. The differential charge pump circuit according to claim 1, wherein said third-common-mode current source and said first current source are combined into a single current source.

3. The differential charge pump circuit according to claim 1, wherein said first level is a high level and said second level is a low level.

4. The differential charge pump circuit according to claim 1, wherein the comparison signal is generated by a slicer.

5. A differential charge pump circuit for eliminating influence of mismatches between current sources, the differential charge pump circuit comprising:

a capacitor for providing an output voltage and having a first terminal and a second terminal;

a first current source for providing a first current;

a first switch connected between said first current source and the first terminal of said capacitor, said first switch being turned ON when a comparison signal is a first level;

a second current source for providing a second current;

a second switch connected between the second terminal of said capacitor and said second current source, said second switch being turned ON when the comparison signal is the first level;

a third switch connected between said first current source and the second terminal of said capacitor, said third switch being turned ON when the comparison signal is a second level;

a fourth switch connected between the first terminal of said capacitor and said second current source, said fourth switch being turned ON when the comparison signal is the second level;

a first-common-mode current source being connected to said first current source for providing a first common mode current;

a second-common-mode current source being connected to said second current source for providing a second common mode current; and a third-common-mode current source connected in parallel with said first current source for providing a third common mode current.

6. The differential charge pump circuit according to claim 5, wherein the first level is a high level and the second level is a low level.

7. The differential charge pump circuit according to claim 5, wherein said third-common-mode current source and said first current source are combined into a single current source.

8. The differential charge pump circuit according to claim 5, wherein said second current source and said second-common-mode current source are combined into a single current source.

9. The differential charge pump circuit according to claim 5, wherein the comparison signal is generated by a slicer.

10. A differential charge pump circuit for eliminating influence of mismatches between current sources, the differential charge pulp circuit comprising:

a capacitor for providing an output voltage and having a first terminal and a second terminal;

a first current source for providing a first current;

a first switch connected between said first current source and the first terminal of said capacitor, said first switch being turned ON when a comparison signal is a first level;

a second current source for providing a second current;

a second switch connected between the second terminal of said capacitor and said second current source, said second switch being turned ON when the comparison signal is the first level;

a third switch connected between said first current source and the second terminal of said capacitor, said third switch being turned ON when the comparison signal is a second level;

a fourth switch connected between the first terminal of said capacitor and said second current source, said fourth switch being turned ON when the comparison signal is the second level; and a common mode current source being directly connected to said first current source for providing a common mode current.

11. The differential charge pump circuit according to claim 10, wherein the first level is a high level and the second level is a low level.

12. The differential charge pump circuit according to claim 10, wherein the comparison signal is generated by a slicer.

* * * * *